United States Patent
Nunan et al.

(10) Patent No.: US 9,917,243 B2
(45) Date of Patent: Mar. 13, 2018

(54) METHOD OF FABRICATING PIEZOELECTRIC MEMS DEVICES

(71) Applicant: Analog Devices, Inc., Norwood, MA (US)

(72) Inventors: Thomas Kieran Nunan, Carlisle, MA (US); Eugene Oh Hwang, Medford, MA (US); Sunil Ashok Bhave, Cambridge, MA (US)

(73) Assignee: Analog Devices, Inc., Norwood, MA (US)

( * ) Notice: Subject to any disclaimer, the term of this patent is extended or adjusted under 35 U.S.C. 154(b) by 559 days.

(21) Appl. No.: 14/515,929

(22) Filed: Oct. 16, 2014

(65) Prior Publication Data
US 2016/0111625 A1   Apr. 21, 2016

(51) Int. Cl.
*H01L 21/311* (2006.01)
*H01L 21/32* (2006.01)
(Continued)

(52) U.S. Cl.
CPC ........ *H01L 41/047* (2013.01); *G01C 19/5769* (2013.01); *H01L 41/0475* (2013.01);
(Continued)

(58) Field of Classification Search
None
See application file for complete search history.

(56) References Cited

U.S. PATENT DOCUMENTS

| 4,655,081 A | 4/1987 | Burdess ........................ 73/505 |
| 5,616,864 A | 4/1997 | Johnson et al. ........... 73/504.13 |

(Continued)

FOREIGN PATENT DOCUMENTS

| EP | 0 860 685 | 8/1998 |
| JP | 09-116250 | 5/1997 |

(Continued)

OTHER PUBLICATIONS

European Patent Office, Extended European Search Report—Application No. 15189732.9-1556, dated Mar. 7, 2016, 9 pages.
(Continued)

*Primary Examiner* — Shamim Ahmed
(74) *Attorney, Agent, or Firm* — Wolf, Greenfield & Sacks, P.C.

(57) ABSTRACT

A single photo mask can be used to define the three critical layers for the piezoelectric MEMS device, specifically the top electrode layer, the piezoelectric material layer, and the bottom electrode layer. Using a single photo mask removes the misalignment source caused by using multiple photo masks. Furthermore, in certain exemplary embodiments, all electrical interconnects use underpass interconnect. This simplifies the process for defining the device electrodes and the process sequence for achieving self-alignment between the piezoelectric element and the top and bottom electrodes. This self-alignment is achieved by using an oxide hard mask to etch the critical region of the top electrode, the piezoelectric material, and the bottom electrode with one mask and different etch chemistries depending on the layer being etched.

20 Claims, 10 Drawing Sheets

(51) Int. Cl.
  *H01L 41/047* (2006.01)
  *G01C 19/5769* (2012.01)
  *H01L 41/29* (2013.01)
  *H01L 41/332* (2013.01)
  *H01L 41/113* (2006.01)
  *H01L 41/08* (2006.01)

(52) U.S. Cl.
  CPC ...... *H01L 41/0477* (2013.01); *H01L 41/0478* (2013.01); *H01L 41/113* (2013.01); *H01L 41/29* (2013.01); *H01L 41/332* (2013.01); *H01L 41/0805* (2013.01)

(56) References Cited

U.S. PATENT DOCUMENTS

| | | | |
|---|---|---|---|
| 5,767,405 A | 6/1998 | Bernstein et al. | 73/504.16 |
| 6,151,964 A | 11/2000 | Nakajima | 73/504.13 |
| 6,209,393 B1 | 4/2001 | Tomikawa et al. | 73/504.12 |
| 6,240,781 B1 | 6/2001 | Namerikawa et al. | 73/504.13 |
| 6,438,242 B1 | 8/2002 | Howarth | 381/190 |
| 6,492,222 B1* | 12/2002 | Xing | G11C 11/22 |
| | | | 257/E21.009 |
| 6,877,374 B2 | 4/2005 | Geen | 73/504.14 |
| 7,032,451 B2 | 4/2006 | Geen | 73/504.14 |
| 7,043,985 B2 | 5/2006 | Ayazi et al. | 73/504.04 |
| 7,089,792 B2 | 8/2006 | Geen | 73/504.14 |
| 7,204,144 B2 | 4/2007 | Geen | 73/504.14 |
| 7,216,539 B2 | 5/2007 | Geen | 73/504.14 |
| 7,357,025 B2 | 4/2008 | Geen | 73/504.12 |
| 7,382,078 B2* | 6/2008 | Bradley | H03H 3/02 |
| | | | 257/414 |
| 7,420,318 B1 | 9/2008 | Pulskamp | 310/328 |
| 7,637,156 B2 | 12/2009 | Araki et al. | 73/504.12 |
| 8,056,413 B2 | 11/2011 | Yazdi | 73/504.13 |
| 8,278,802 B1* | 10/2012 | Lee | B81C 1/00476 |
| | | | 29/25.35 |
| 8,408,060 B2 | 4/2013 | Kuang et al. | 73/504.13 |
| 8,549,918 B2 | 10/2013 | Kuang et al. | 73/504.13 |
| 8,555,718 B2 | 10/2013 | Kuang et al. | 73/504.13 |
| 2002/0149300 A1* | 10/2002 | Kaitila | H03H 3/02 |
| | | | 310/364 |
| 2004/0085000 A1 | 5/2004 | Ogiura | 310/329 |
| 2005/0072230 A1 | 4/2005 | Koike et al. | 73/504.12 |
| 2006/0273867 A1* | 12/2006 | Piazza | H03H 3/02 |
| | | | 333/189 |
| 2007/0069342 A1 | 3/2007 | Inaba | 257/666 |
| 2007/0284971 A1 | 12/2007 | Sano et al. | 310/364 |
| 2010/0058861 A1 | 3/2010 | Kuang et al. | 73/504.12 |
| 2010/0096714 A1* | 4/2010 | Nakatani | G01L 9/0042 |
| | | | 257/419 |

FOREIGN PATENT DOCUMENTS

| | | |
|---|---|---|
| JP | 2010-147285 | 7/2010 |
| WO | WO 2007/061610 | 5/2007 |

OTHER PUBLICATIONS

Ayazi et al., Design and Fabrication of a High-Performance Polysilicon Vibrating Ring Gyroscope; Center for Integrated Sensors and Circuits; Eleventh IEEE/ASME International Workshop on Micro Electro Mechanical Systems, Heidelberg, Germany, Jan. 25-29, 1998.

Ayazi et al., High Aspect-Ratio Combined Poly and Single-Crystal Silicon (HARPSS) MEMS Technology; Journal of Microelectromechanical Systems, vol. 9, No. 3, Sep. 2000.

Ayazi et al., A HARPSS Polysilicon Vibrating Ring Gyroscope Journal of Microelectromechanical Systems, vol. 10, No. 2, Jun. 2001.

Geen et al., New iMEMS® Angular-Rate-Sensing Gyroscope; ADI Micromachined Products Division; Analog Dialogue 37-5, 2003.

Link, "Angular Rate Detector DAVED®-RR," Application Report SE 090.2; Institute of Micromachining and Information Technology, http://hsgimit.de/fileadmin/gfx/pdfs/AnwendungsberichtSE090_2rr_englisch_V1.pdf, 1 page, Dec. 11, 2007.

Link, "Angular Rate Detector DAVED®-LL," Application Report SE 100.1; Institute of Micromachining and Information Technology, hsg-imit.de/fileadmin/gfx/pdfs/anwendungsberichtse100_111_englisch01.pdf, 1 page, Dec. 11, 2007.

Nasiri, "A Critical Review of MEMS Gyroscopes Technology and Commercialization Status," InvenSense, www.scantec.de/uploads/media/MEMSGyroComp_02.pdf , 8 pages, 2005.

Yang et al., An electro-thermal bimorph-based microactuator for precise track-positioning of optical disk drives; J. Micromech. Microeng., v. 15, pp. 958-965, 2005.

NEC TOKIN, "Ceramic Gyro™," NEC TOKIN's Piezoelectric Devices, http://www.nec-tokin.com/english/product/piezodevice2/ceramicgyro.html, May 1, 2012, 5 pages.

* cited by examiner

FIG. 21

METHOD OF FABRICATING PIEZOELECTRIC MEMS DEVICES

TECHNICAL FIELD

The present invention relates to fabrication of piezoelectric MEMS devices.

BACKGROUND ART

In a vibratory MEMS gyroscope, a mass is driven to resonate, e.g., in a translational, rotational, flexural, or bulk acoustic mode, by a set of drive electrodes, and motion is detected through a set of sense electrodes. Gyroscope errors and performance is determined, in part, by the matching and optimum alignment of the drive and sense electrodes with respect to the mode shape of operation. Photo mask misalignment is one source of these errors if more than one photo mask is used to define the critical layers of the MEMS gyroscope structures.

SUMMARY OF THE EMBODIMENTS

In a first embodiment of the invention there is provided a piezoelectric device comprising a top electrode; a piezoelectric element under the top electrode and self-aligned with the top electrode; and a bottom electrode under the piezoelectric element and self-aligned with the top electrode and the piezoelectric element.

In various alternative embodiments, the piezoelectric element may be an aluminum nitride piezoelectric element. The top electrode may be a molybdenum electrode. The bottom electrode may be an N++ electrode such as a doped polysilicon electrode. The piezoelectric device may be a bulk acoustic wave piezoelectric gyroscope.

In certain other embodiments, the bottom electrode may be formed from a bottom electrode material layer, and the piezoelectric gyroscope may further comprise an isolation trench within the bottom electrode material layer, the isolation trench forming an electrically-isolated anchor in the bottom electrode material layer to which the top electrode is coupled. The device may further comprise a first electrical contact to the bottom electrode and a second electrical contact to the electrically-isolated anchor for making an electrical connection to the top electrode, wherein the first and second electrical contacts run underneath the bottom electrode material layer and include conductive vias to the bottom electrode material layer. The first and second electrical contacts may be polysilicon electrical contacts. The device may further comprise a first metallic bond pad electrically coupled to the first electrical contact and a second metallic bond pad electrically coupled to the second electrical contact, wherein the top electrode is formed from a top electrode material layer, and wherein the first and second metallic bond pads are at a metallic material layer above the top electrode material layer.

In a second embodiment of the invention there is provided a method of fabricating a piezoelectric device comprising forming a piezoelectric material layer on a bottom electrode material layer; forming a top electrode on the piezoelectric material layer; and etching the piezoelectric material layer and the bottom electrode material layer to produce a piezoelectric element and a bottom electrode self-aligned with the top electrode.

In various alternative embodiments, forming the piezoelectric material layer may involve forming an aluminum nitride material layer. Forming the top electrode may involve forming a molybdenum material layer; patterning the molybdenum material layer; and etching the molybdenum material layer to form a molybdenum electrode. The bottom electrode material layer may be an N++ material layer such as a doped polysilicon material layer. Etching the piezoelectric material layer and the bottom electrode material layer may involve forming an oxide hard mask; patterning the oxide hard mask to expose portions of the piezoelectric material layer to be etched; etching the exposed portions of the piezoelectric material layer to expose portions of the bottom electrode material layer to be etched; and etching the exposed portions of the bottom electrode material layer.

In certain other embodiments, the method may further involve forming an isolation trench within the bottom electrode material layer, the isolation trench forming an electrically-isolated anchor in the bottom electrode material layer to which the top electrode is coupled. The method may further involve forming a first electrical contact to the bottom electrode and forming a second electrical contact to the electrically-isolated anchor for making an electrical connection to the top electrode, wherein the first and second electrical contacts run underneath the bottom electrode material layer and include conductive vias to the bottom electrode material layer. Forming the first and second electrical contacts may involve forming polysilicon electrical contacts. The method may further involve forming a first metallic bond pad electrically coupled to the first electrical contact and forming a second metallic bond pad electrically coupled to the second electrical contact, wherein the top electrode is formed from a top electrode material layer, and wherein the first and second metallic bond pads are at a metallic material layer above the top electrode material layer.

BRIEF DESCRIPTION OF THE DRAWINGS

The foregoing features of embodiments will be more readily understood by reference to the following detailed description, taken with reference to the accompanying drawings, in which.

It should be noted that the foregoing figures and the elements depicted therein are not necessarily drawn to consistent scale or to any scale. Unless the context otherwise suggests, like elements are indicated by like numerals.

DETAILED DESCRIPTION OF SPECIFIC EMBODIMENTS

Embodiments of the present invention use a single photo mask to define the three critical layers for the piezoelectric MEMS device, specifically the top electrode layer, the piezoelectric material layer, and the bottom electrode layer. Using a single photo mask removes the misalignment source caused by using multiple photo masks.

Furthermore, in certain exemplary embodiments, all electrical interconnects use underpass interconnect. This simplifies the process for defining the device electrodes and the process sequence for achieving self-alignment between the piezoelectric element and the top and bottom electrodes. This self-alignment is achieved by using an oxide hard mask to etch the critical region of the top electrode, the piezoelectric material, and the bottom electrode with one mask and different etch chemistries depending on the layer being etched.

Figure 1:
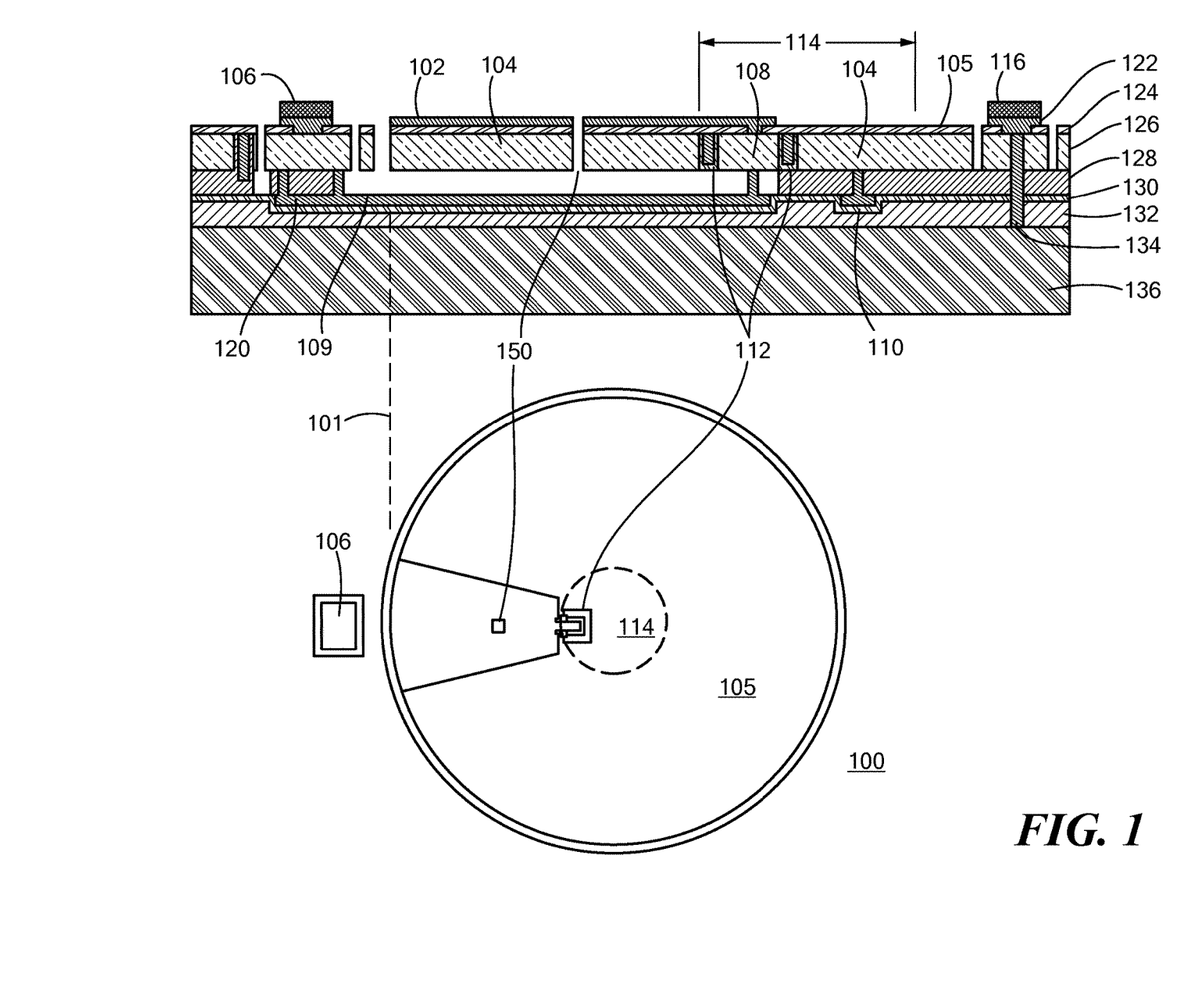
FIG. 1 is a schematic diagram showing cross-sectional and top views of an exemplary piezoelectric gyroscope 100 in accordance with an exemplary embodiment of the present invention.

FIG. 1 is a schematic diagram showing cross-sectional and top views of an exemplary piezoelectric gyroscope 100 in accordance with an exemplary embodiment of the present invention. For convenience, these two views are not drawn to the same scale. The main components of this exemplary piezoelectric gyroscope are a disk 105 of piezoelectric material, a disk 104 underlying the disk 105 and representing a bottom electrode, and a top electrode 102 overlying a portion of the disk 105. In this exemplary embodiment, the disk 104 is an N++ silicon (e.g., doped silicon) material, the disk 105 is aluminum nitride (AlN), and the top electrode 102 is molybdenum (Moly), although other appropriate materials may be used in various alternative embodiments. The disk 104 is anchored to an underlying substrate within a hub region 114. In order to provide electrical connections to both the top electrode 102 and the bottom electrode 104 via various runners formed at a polysilicon layer 118 underlying the disk 104, the top electrode 102 and the bottom electrode 104 must be electrically isolated from one another, which is accomplished in this exemplary embodiment by an isolation trench 112 formed through the disk 104. In this exemplary embodiment, the isolation trench 112 is a nitride/oxide (Nit/Ox) lined polysilicon-filled trench, although other appropriate materials may be used in various alternative embodiments. The isolated portion 108 of the disk 104 created by the isolation trench 112 provides an anchor and electrical contact to the top electrode 102. Electrical contacts (runners) 109 and 110 to the top and bottom electrodes, respectively, are formed from the polysilicon layer 118. A bond pad 106 providing for electrical connection to the top electrode via the contact/runner 109 is shown. A bond pad 116 for making an electrical connection to the silicon substrate 120 is shown in the cross-sectional view. For convenience, a bond pad providing for electrical connection to the bottom electrode via the contact/runner 110 is not shown, although this bond pad would be formed substantially as the bond pad 106 is formed, i.e., a bond pad formed on top of a Moly 122, AlN 124, N++ 126, oxide 128 stack. The bond pads are typically metal. Using principles known in the art, the piezoelectric disk 105 can be made to resonate by placing alternating electrical signals on the top and bottom electrodes 102 and 104, and external movements of the gyroscope can be sensed via various sense electrodes that, for convenience, are not shown. Such sense electrodes may be configured to sense in-plane and/or out-of-plane movements of the disk 105 caused by external movements of the gyroscope. An etch release hole 150 is discussed more fully below.

An exemplary fabrication process for fabricating the exemplary piezoelectric gyroscope 100 is now described with reference to FIGS. 2-21. In essence, this exemplary fabrication process starts building the exemplary piezoelectric gyroscope 100 upside-down from what is shown in FIG. 1, i.e., fabricating the layers starting with N++ 126 through oxide 132, bonding a silicon wafer 136 onto the oxide layer 132 (e.g., direct silicon bonding or fusion bonding), and then flipping the device over to fabricate the AlN 124 structures, the Moly 122 structures, and bond pads (e.g., 106, 116), e.g., using the silicon wafer 136 as a handling wafer for such "back-side" processing. Purely for convenience, fabrication steps involved with formation of the bond pad 116 and its associated polysilicon 134 via to the silicon substrate 136 are not shown, although it will be apparent to persons of ordinary skill in the art how such structures can be formed within the described fabrication process.

Figure 2:
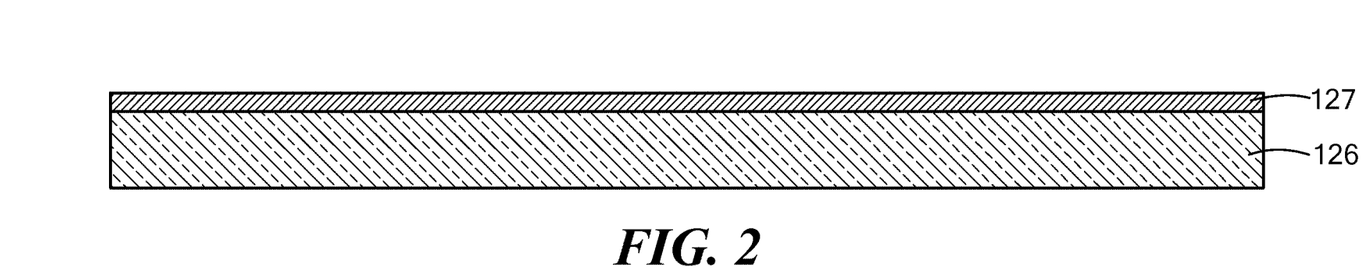
FIGS. 2-21 are schematic diagrams used to represent various fabrication process steps in fabricating the exemplary piezoelectric gyroscope in accordance with an exemplary embodiment of the present invention.

In FIG. 2, a layer of oxide 127 is deposited onto a substrate of N++ 126. In this exemplary embodiment, the N++ 126 is approximately 750 microns and the oxide 127 is deposited to a thickness of approximately 1 micron.

Figure 3:
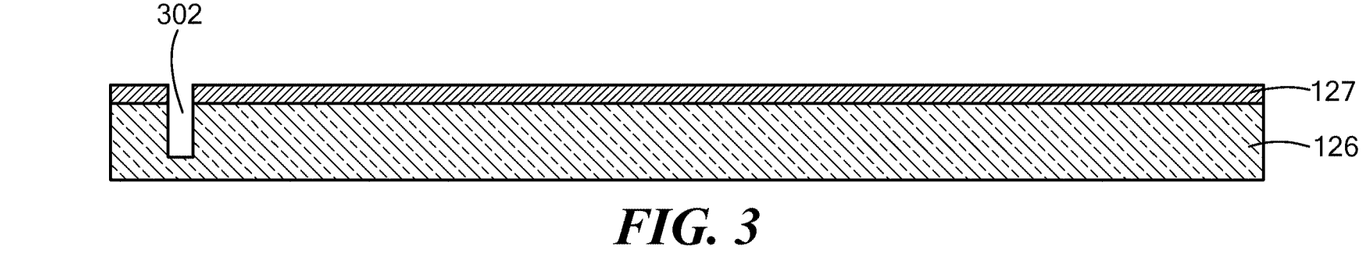

In FIG. 3, an alignment trench 302 is formed by etching through the oxide 127 layer into the N++ 126 layer. In this exemplary embodiment, the alignment trench 302 is approximately 25 microns deep for a 20 micron device layer. In essence, all masking operations in later fabrication steps are aligned using the alignment trench 302 such that the alignment trench 302 represents a fixed reference for masking/etching operations.

Figure 4:
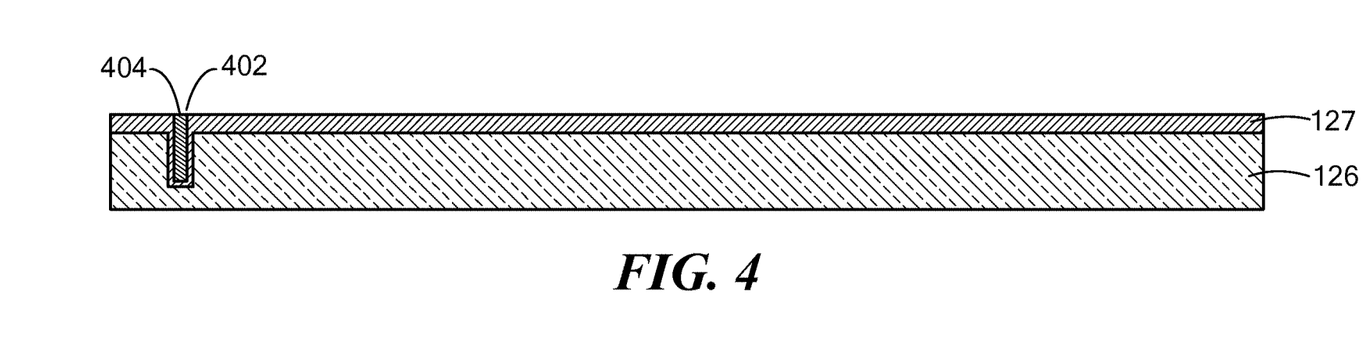

In FIG. 4, additional oxide 402 is deposited to line the alignment trench 302. The lined trench 302 is then filled with polysilicon 404, specifically by depositing polysilicon sufficiently to fill the lined trench 302, which also deposits polysilicon on the surface of the oxide 127, and then blanket etching the polysilicon to remove the polysilicon on the surface of the oxide 127 layer to leave the lined trench filled with polysilicon 404. The lined, filled trench 302 is used as an alignment key in later fabrication steps.

Figure 5:
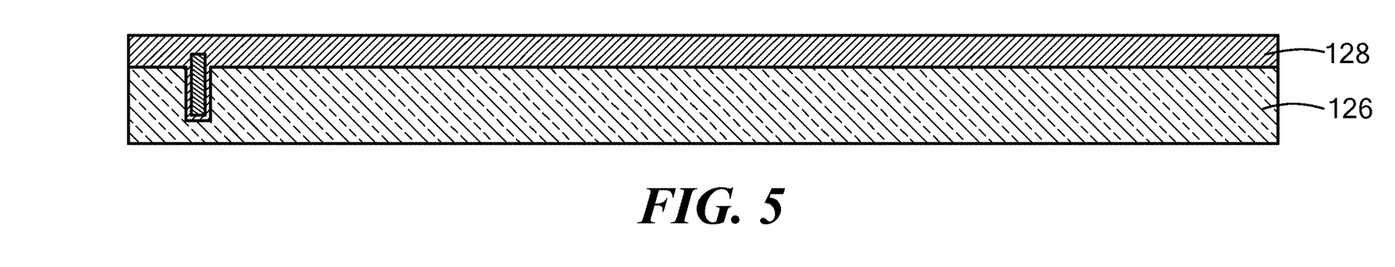

In FIG. 5, the oxide 127 is removed, and a new oxide layer 128 is deposited and polished through a chemical mechanical polish (CMP) operation. In this exemplary embodiment, the additional oxide 128 is formed to a thickness of approximately 2 microns plus or minus 0.2 microns.

Figure 6:
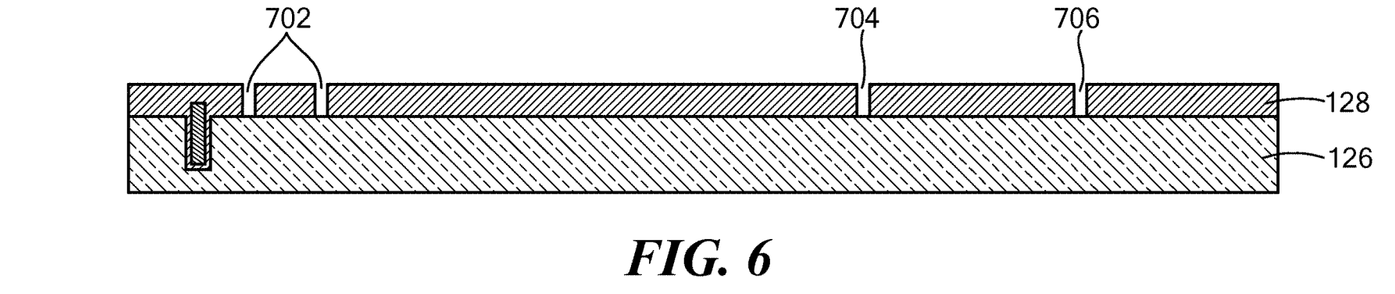

In FIG. 6, trenches for the various polysilicon layer 118 "vias" are etched through the oxide 128 layer, specifically by masking and etching through the oxide 128 layer. Here, trenches 702 are formed for the portion of the electrical contact 109 underneath the bond pad 106, trench 704 is formed for the portion of the electrical contact 109 underneath the isolated portion 108, and trench 706 is formed for the portion of the electrical contact 110 for making electrical connection to the bottom electrode 104.

Figure 7:
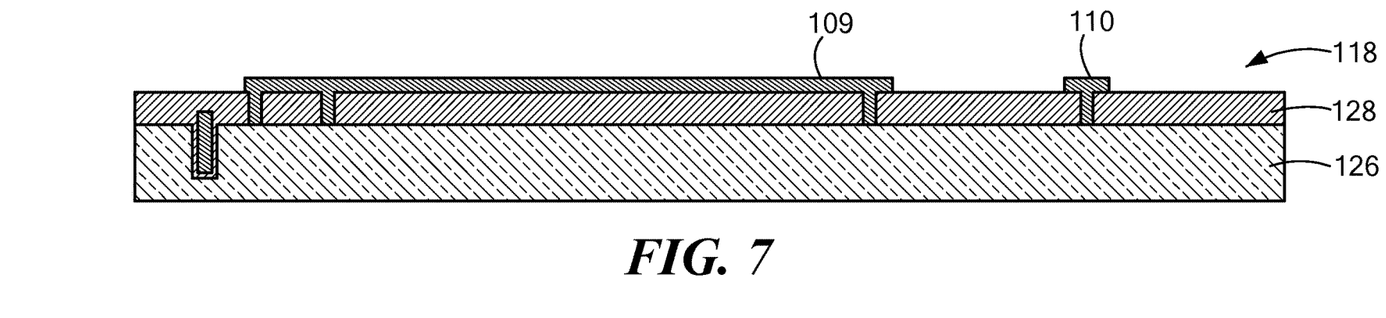

In FIG. 7, polysilicon layer 118 is deposited and patterned, specifically by masking and etching, in order to fill the trenches 702, 704, 706 and form the electrical contacts 109 and 110. Deposition of the polysilicon 118 fills the trenches and places a layer of polysilicon onto the oxide 128. This layer of polysilicon is then patterned, specifically by masking and etching.

Figure 8:
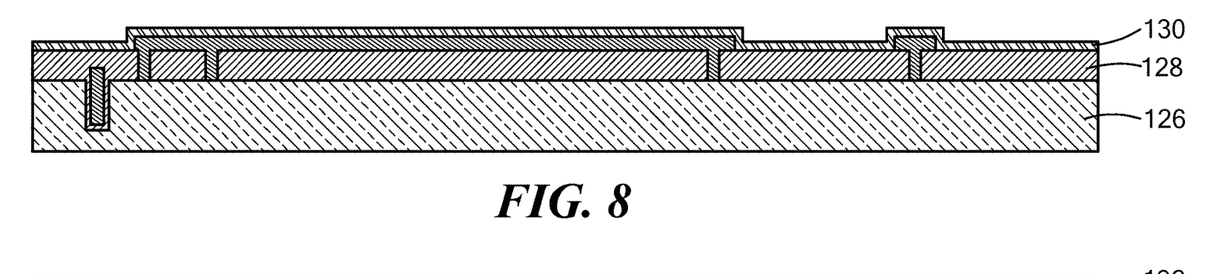

In FIG. 8, a layer of low-stress nitride (LSN) is deposited over the exposed oxide 128 and polysilicon 118 as an etch stop layer for later fabrication steps.

Figure 9:
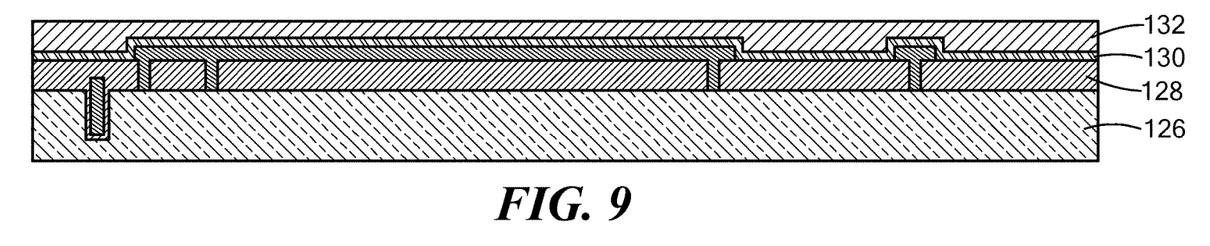

In FIG. 9, an oxide 132 layer is formed on the LSN 130 layer, specifically by deposition and CMP of the oxide 132.

Figure 10:
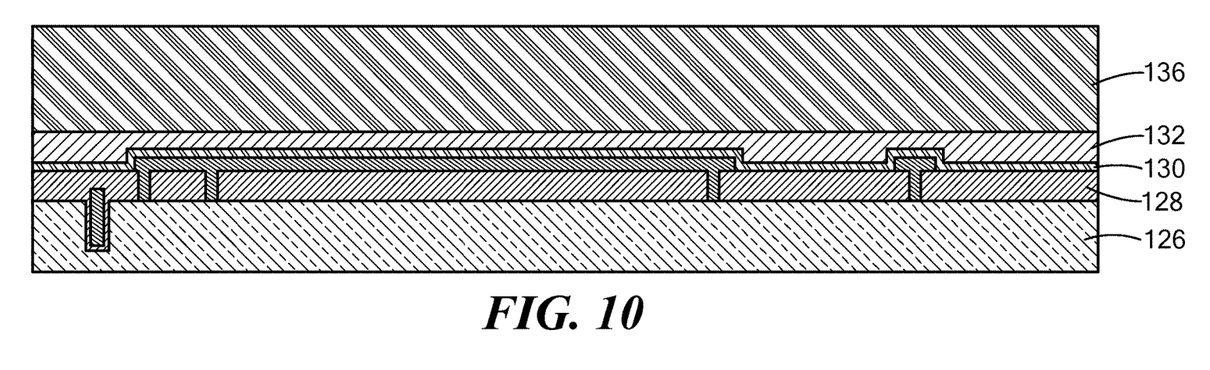

In FIG. 10, a silicon wafer substrate 136 is direct wafer bonded to the oxide 132 layer. This silicon wafer substrate 136 is used as a handling wafer for "back-side" processing in which the device is flipped over and fabrication steps are performed on the N++ 126 side of the device.

Figure 11:
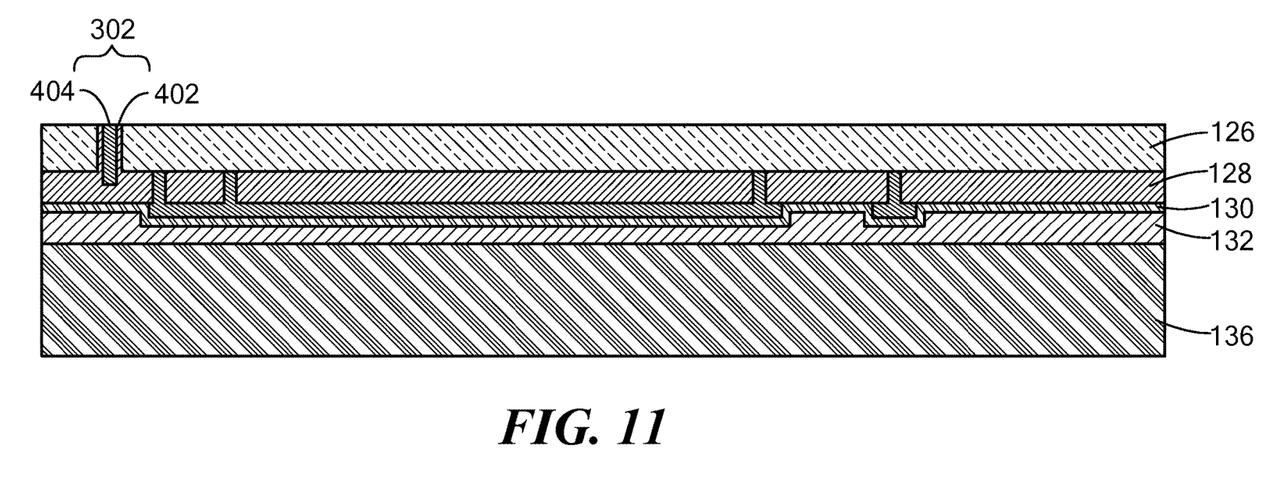

FIG. 11 shows the device flipped over for back-side processing. In FIG. 11, the N++ layer is ground and polished to the desired device layer thickness (in this exemplary embodiment, approximately 20 microns), which also exposes the lined 402, filled 404 alignment trench 302 for use as an alignment key in later fabrication steps.

Figure 12:
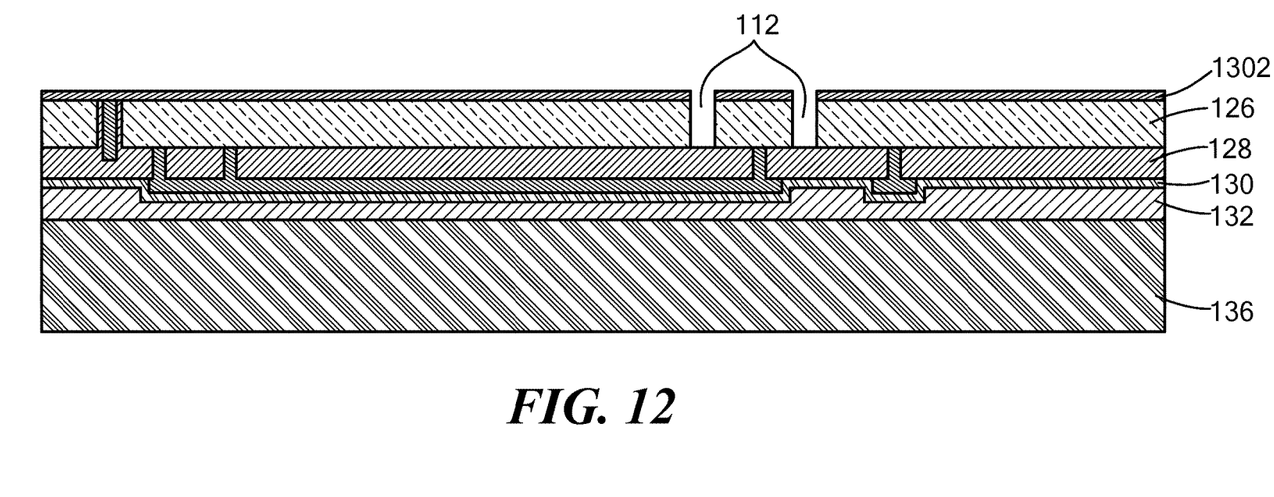

In FIG. 12, a temporary thermal oxide layer 1302 is formed on the N++ 126 layer, and then isolation trench 112 is formed by patterning by masking and etching through the oxide 1302 and N++ 126 layers to the oxide 128 layer. The isolation trench 112 is lined and filled in later fabrication processes. As discussed above, the isolated portion of the disk 104 (which is formed of N++ 126 material) created by the isolation trench 112 provides an anchor and electrical contact 108 to the top electrode 102.

Figure 13:
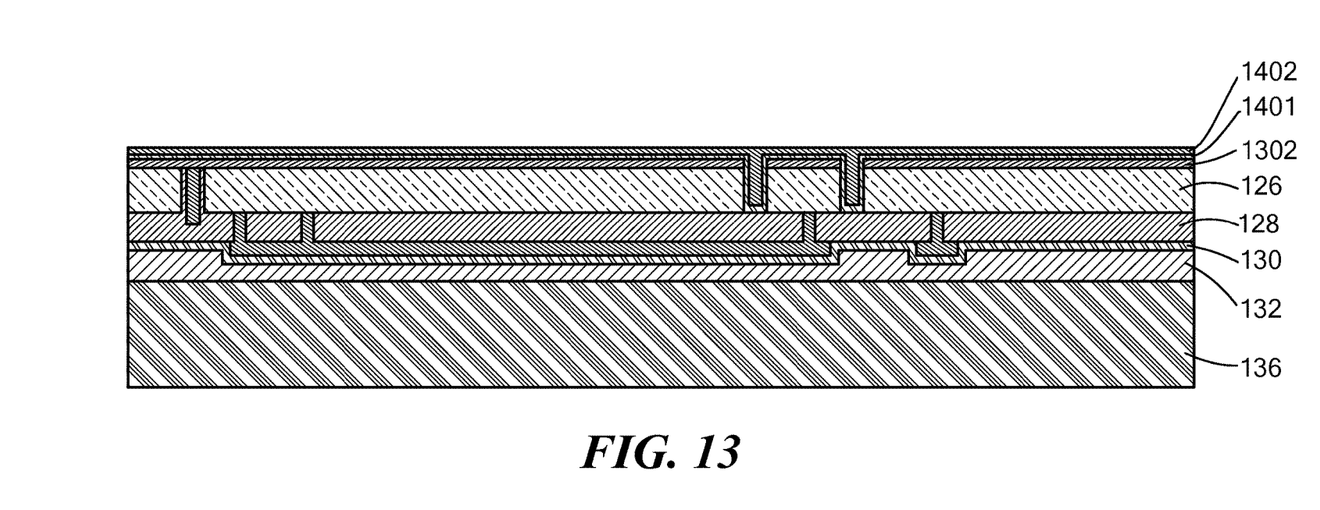

In FIG. 13, the isolation trench 112 is lined, specifically by depositing a layer of nitride 1401 over the oxide 1302. This nitride layer lines the trench 112. Then, polysilicon 1402 is deposited to fill the lined isolation trench 112 and form a polysilicon 1402 layer on the nitride 1401 layer.

Figure 14:
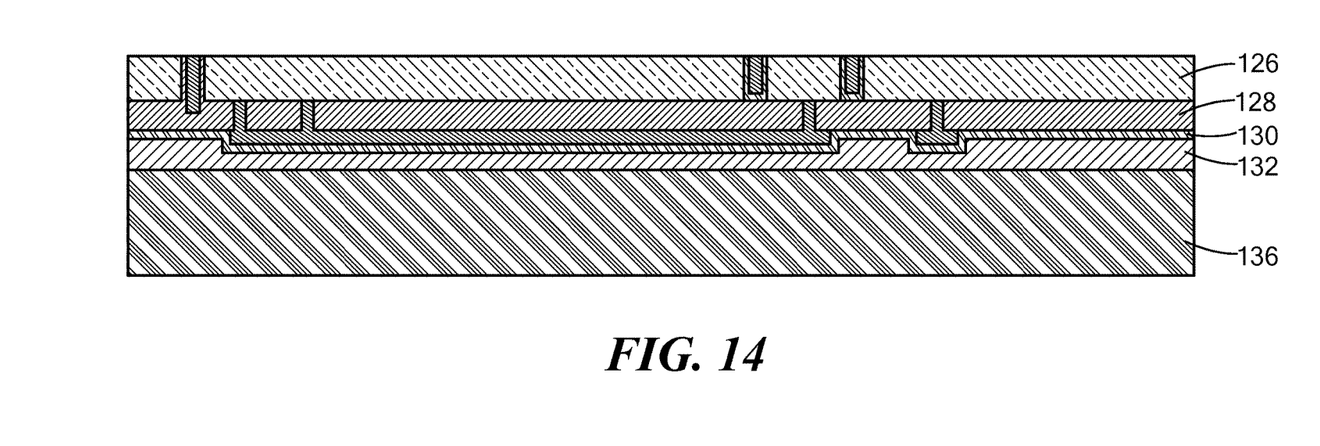

In FIG. 14, a series of processes are performed to remove the polysilicon 1402 layer, the surface nitride 1401 layer, and the temporary thermal oxide 1302 layer. Specifically, a blanket polysilicon etch process is used to remove the polysilicon 1402 layer, with the nitride 1401 layer acting as an etch stop layer. Then, a hot phosphoric acid etch is performed to remove the surface nitride 1401 layer, and then a timed wet oxide etch is performed to remove the temporary thermal oxide 1302 layer.

Figure 15:
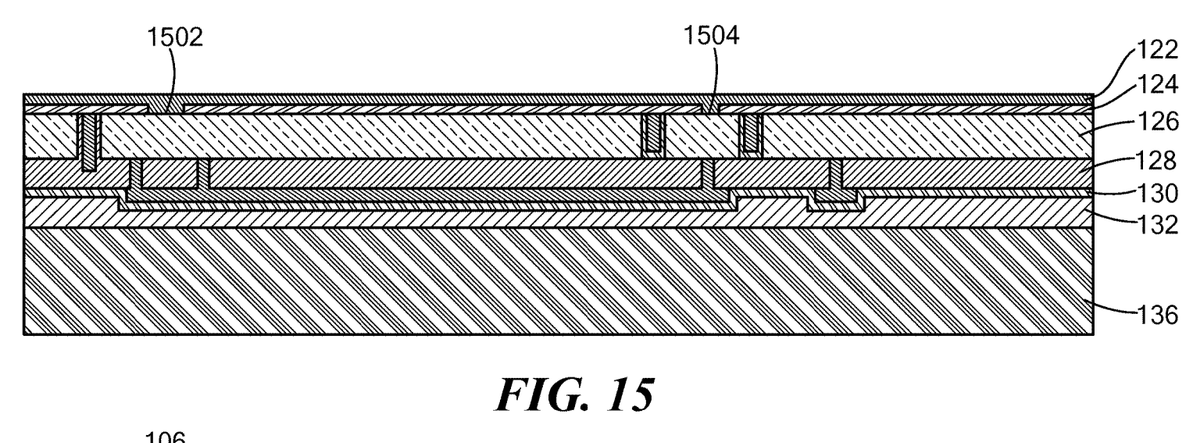

In FIG. 15, a layer of piezoelectric AlN 124 is deposited and patterned by masking and etching to define contact holes 1502 and 1504. Then, a layer of Moly 122 is deposited.

Figure 16:
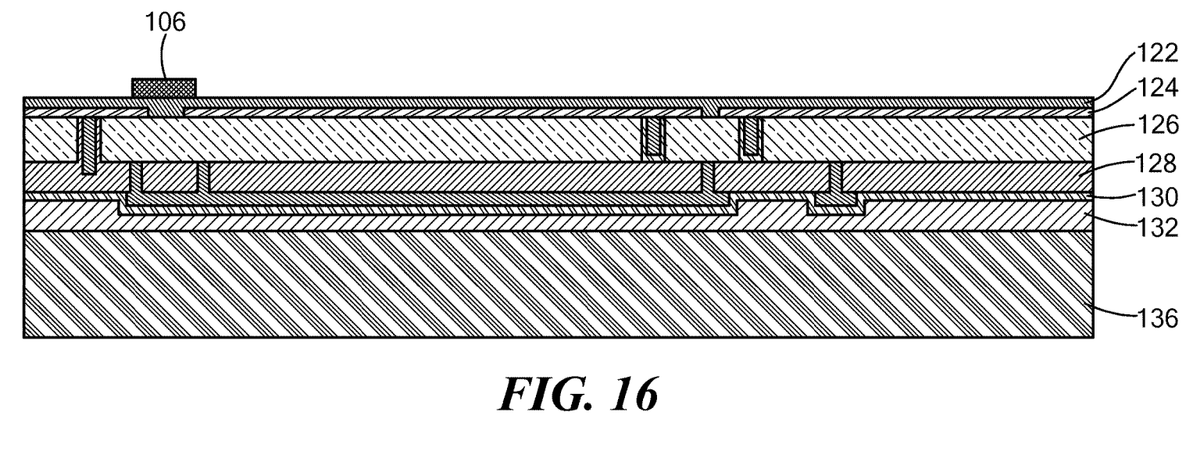

In FIG. 16, metal bond pads including bond pad 106 (shown), bond pad 116 (not shown), and a bond pad for the electrical contact 110 (not shown) are formed on the Moly 122 layer. This involves depositing metal (in this exemplary embodiment, aluminum) and then patterning the metal by masking and etching to form the bond pads and optionally a bond ring (not shown) surrounding the resonator if the device is to be capped.

Figure 17:
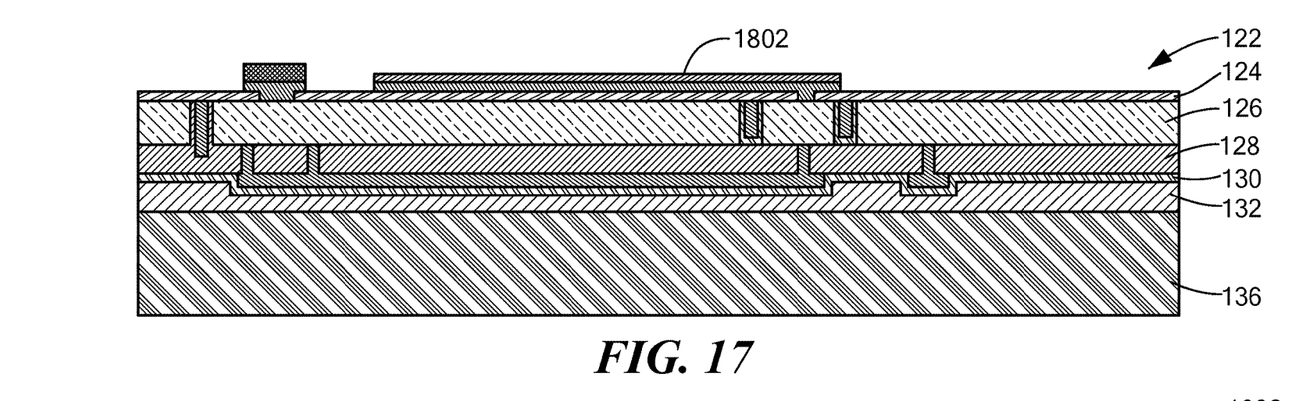
Figure 21:
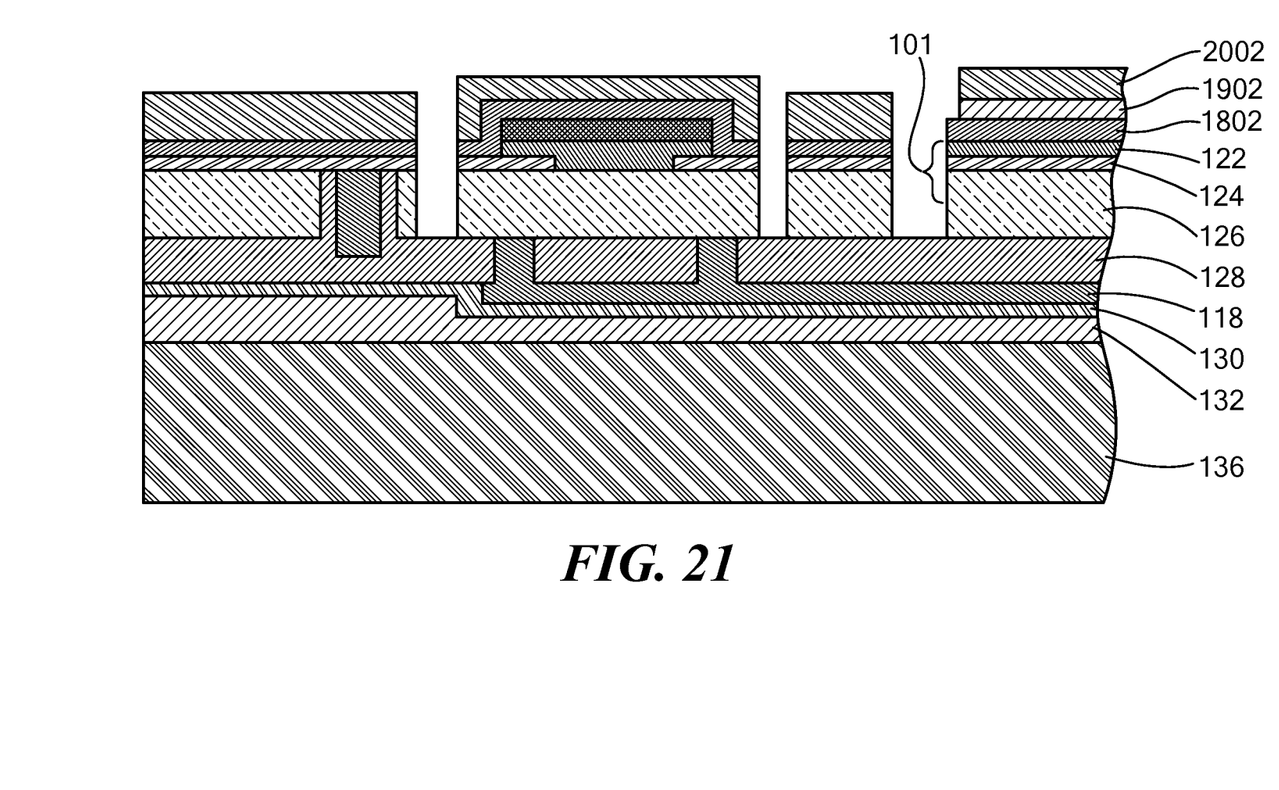

In FIG. 17, an oxide hard mask 1802 is deposited, the oxide hard mask 1802 is patterned by masking and etching to expose portions of the Moly 122 to be etched including the portion represented at location 101 in FIGS. 1 and 21 (i.e., any Moly 122 not being etched is covered with oxide 1802), and the Moly 122 is etched using the oxide hard mask 1802 to form the Moly 122 top electrode 102 and other Moly 122 structures. It should be noted that various etch release holes 150 (not shown in FIG. 17) may be formed through the Moly 122 top electrode 102 to facilitate release of the piezoelectric disk in later fabrication steps.

Figure 18:
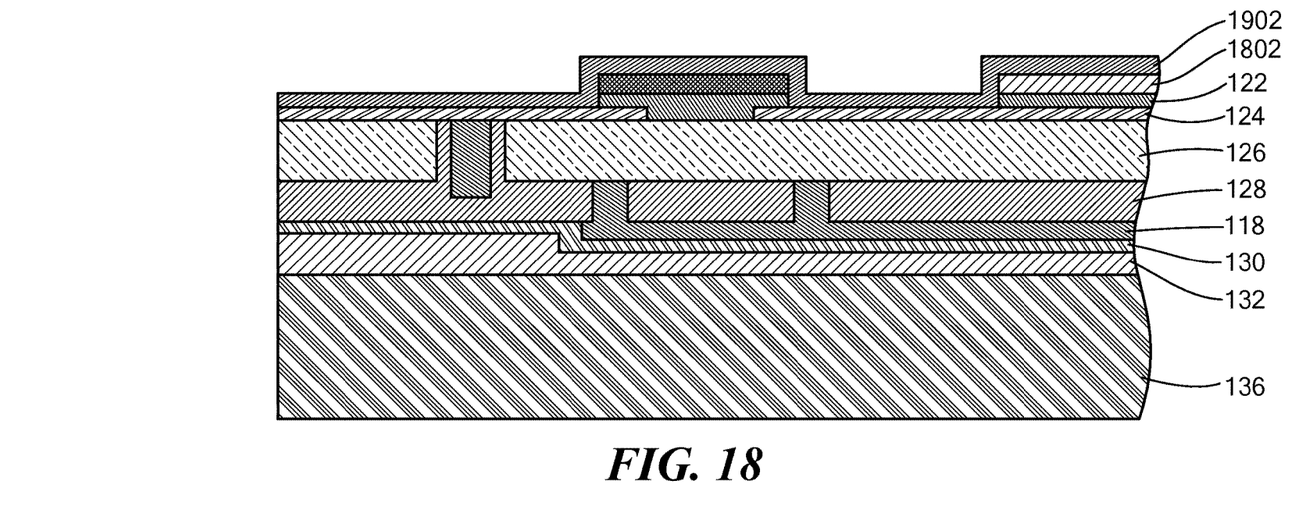

In FIG. 18 (which shows a magnified view of a portion of the structures shown in FIG. 17), a second oxide hard mask 1902 is deposited.

Figure 19:
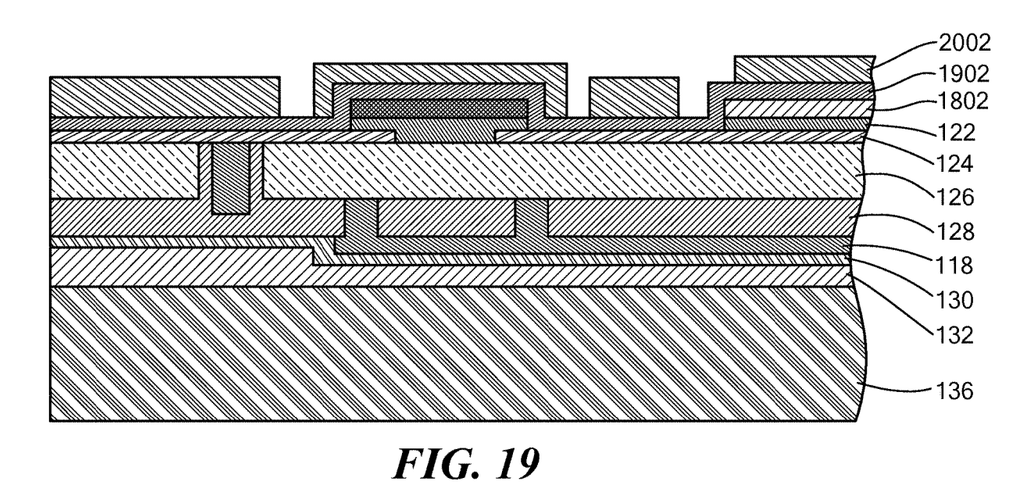

In FIG. 19, a photoresist material layer 2002 is deposited and patterned to expose portions of the second oxide hard mask 1902 that will be etched. This step may expose a portion of the second oxide hard mask 1902 covering any etch release holes 150 formed through the Moly 122 top electrode 102 as discussed above with reference to FIG. 17 (for convenience, this is not shown in FIG. 19).

Figure 20:
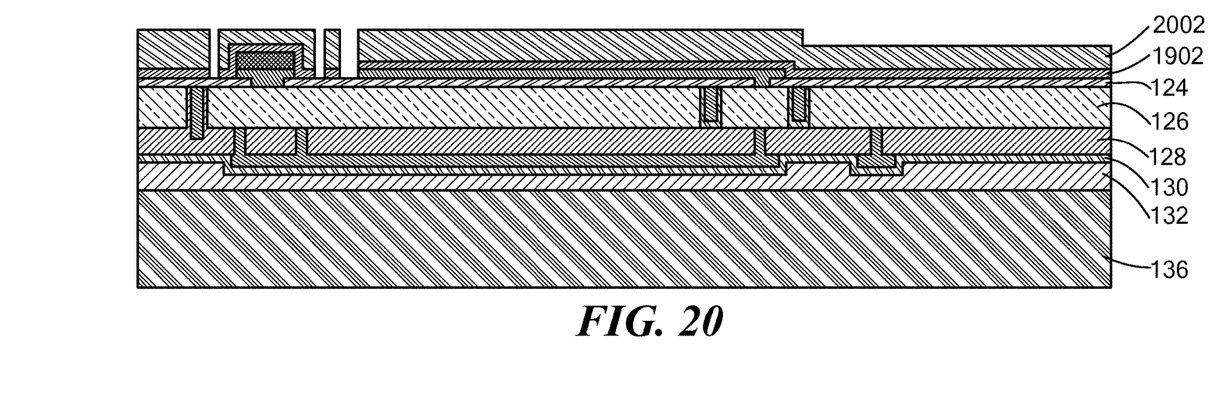

In FIG. 20, the thinner second oxide hard mask 1902 is dry etched via an oxide timed etch process to expose portions of the AlN 124 layer that will be etched, including the portion represented at location 101 in FIGS. 1 and 21 and also including any etch release holes 150 formed through the Moly 122 top electrode 102 as discussed above with reference to FIGS. 17 and 19 (for convenience, this is not shown in FIG. 20). As shown and described with reference to FIG. 21, the combination of the first oxide hard mask 1802 and the thinner second oxide hard mask 1902 that is fully etched to expose the AlN 124 layer without fully etching the first oxide hard mask 1802 provides the self-alignment between the edge of the top moly electrode 122 and the piezoelectric layer 124 and the bottom electrode 126.

In FIG. 21, AlN and silicon etch operations are performed to etch through the AlN 124 and N++ 126 layers where those layers were exposed through the oxide hard masks . Among other things, these etch operations result in self-alignment of the Moly 122 top electrode 102, the AlN 124 disk 105, and the N++ 126 bottom electrode 104, as represented at location 101 in FIGS. 1 and 21. These etch operations also remove portions of the AlN 124 and N++ 126 layers at any etch release holes 150 formed through the second oxide hard mask 1902 and Moly 122 top electrode 102 (for convenience, this is not shown in FIG. 21). These etch operations also expose portions of the oxide 128 layer (including portions of the oxide 128 layer exposed through any etch release holes 150 formed through the Moly 122, AlN 124, and N++ 126 layers as discussed above), particularly to allow for "release" of the piezoelectric disk. It should be noted that, by running the electrical connections 109 and 110 underneath the resonator, electrical connections can be made to both the top electrode 102 and the bottom electrode 104 without having to cross the open trench that surrounds the resonator and without having to cross a bond ring if present.

In subsequent steps leading to the final device configuration 100 shown in FIG. 1, the residual photoresist 2002, oxide 1902, and oxide 1802 are removed using appropriate etching operations. The oxide 128 layer is then dry etched (e.g., using vapor HF etchant) through exposed openings (including any etch release holes 150) to remove portions of the oxide 128 layer underlying the bottom electrode 104 and elsewhere. Removing portions of the oxide 128 layer underlying the bottom electrode 104 effectively "releases" the piezoelectric disk. Any etch release holes 150 also facilitate removal of the oxide 128 layer by providing additional locations for the dry etchant to reach the oxide 128 layer. The LSN 130 layer acts as an etch-stop layer to prevent etching beyond areas where the oxide 128 layer touches the LSN 130 layer.

The various masking steps discussed above typically involve use of a photo mask, i.e., deposition of a photoresist material, exposing portions of the photoresist material using a mask to define areas to be etched, removing photoresist material from the areas to be etched, etching one or more underlying material layers through the removed areas of photoresist material, and then removing the residual photoresist material. Using the alignment trench 302 as a reference for masking helps to align the various masking and etching steps to avoid or reduce the above-mentioned issues with photo mask misalignment.

It should be noted that the exemplary processes discussed above may involve (and often do involve) additional and/or alternate steps that are omitted for convenience. For example, patterning may include various deposition and etching steps, etc.

While exemplary embodiments of the invention are described with reference to a piezoelectric MEMS gyroscope and a piezoelectric element that is a disk, it should be noted that the present invention is not limited to piezoelectric gyroscopes or piezoelectric disk structures. Rather, embodiments of the present invention can apply more generally to other types of piezoelectric MEMS devices and/or to piezoelectric MEMS gyroscopes having piezoelectric elements of other shapes. Furthermore, the present invention is not limited to fabrication of piezoelectric elements such as resonators or proof masses for a gyroscope or inertial sensor. Rather, embodiments of the present invention can apply more generally to other types of piezoelectric elements in MEMS device, such as, for example, piezoelectric transducers described in U.S. Patent Application Publication No. 2010/0058861, which is hereby incorporated herein by reference in its entirety.

The embodiments of the invention described above are intended to be merely exemplary; numerous variations and modifications will be apparent to those skilled in the art. All such variations and modifications are intended to be within the scope of the present invention as defined in any appended claims.

What is claimed is:

1. A method of fabricating a piezoelectric device, the method comprising:
   forming a piezoelectric material layer on a bottom electrode material layer;
   forming a top electrode on the piezoelectric material layer;
   etching the top electrode using a first oxide hard mask; and
   etching the piezoelectric material layer and the bottom electrode material layer using a second oxide hard mask different than the first oxide hard mask to produce a piezoelectric element and a bottom electrode self-aligned with the top electrode.

2. A method according to claim 1, wherein forming the piezoelectric material layer comprises forming an aluminum nitride material layer.

3. A method according to claim 1, wherein forming the top electrode comprises:
   forming a molybdenum material layer;
   patterning the molybdenum material layer; and
   etching the molybdenum material layer to form a molybdenum electrode.

4. A method according to claim 1, wherein the bottom electrode material layer is an N++ material layer.

5. A method according to claim 1, wherein the bottom electrode material layer is a doped silicon material layer.

6. A method according to claim 1, wherein etching the piezoelectric material layer and the bottom electrode material layer using the second oxide hard mask comprises:
   forming an oxide hard mask layer;
   patterning the oxide hard mask layer to form the second oxide hard mask exposing portions of the piezoelectric material layer to be etched;
   etching the exposed portions of the piezoelectric material layer to expose portions of the bottom electrode material layer to be etched; and
   etching the exposed portions of the bottom electrode material layer.

7. A method according to claim 1, further comprising:
   forming an isolation trench within the bottom electrode material layer, the isolation trench forming an electrically-isolated anchor in the bottom electrode material layer to which the top electrode is coupled.

8. A method according to claim 7, further comprising:
   forming a first electrical contact to the bottom electrode; and
   forming a second electrical contact to the electrically-isolated anchor for making an electrical connection to the top electrode, wherein the first and second electrical contacts run underneath the bottom electrode material layer and include conductive vias to the bottom electrode material layer.

9. A method according to claim 8, wherein forming the first and second electrical contacts comprises forming polysilicon electrical contacts.

10. A method according to claim 8, further comprising:
    forming a first metallic bond pad electrically coupled to the first electrical contact; and
    forming a second metallic bond pad electrically coupled to the second electrical contact, wherein the top electrode is formed from a top electrode material layer, and wherein the first and second metallic bond pads are at a metallic material layer above the top electrode material layer.

11. A method of fabricating a piezoelectric device, the method comprising:
    forming a piezoelectric material layer on a bottom electrode material layer;
    forming a top electrode on the piezoelectric material layer;
    etching at least the top electrode using a first oxide hard mask; and
    self-aligning the piezoelectric material layer and the bottom electrode material layer with the top electrode by etching with a second oxide hard mask different than the first oxide hard mask.

12. A method according to claim 11, wherein self-aligning the piezoelectric material layer and the bottom electrode material layer with the top electrode using the second oxide hard mask comprises:
    forming an oxide hard mask layer;
    patterning the oxide hard mask layer to form the second oxide hard mask exposing portions of the piezoelectric material layer to be etched;
    etching the exposed portions of the piezoelectric material layer to expose portions of the bottom electrode material layer to be etched; and
    etching the exposed portions of the bottom electrode material layer.

13. A method according to claim 11, further comprising:
    forming an isolation trench within the bottom electrode material layer, the isolation trench forming an electrically-isolated anchor in the bottom electrode material layer to which the top electrode is coupled.

14. A method according to claim 13, further comprising:
    forming a first electrical contact to the bottom electrode material layer; and
    forming a second electrical contact to the electrically-isolated anchor for making an electrical connection to the top electrode, wherein the first and second electrical contacts run underneath the bottom electrode material layer and include conductive vias to the bottom electrode material layer.

15. A method according to claim 14, further comprising:
    forming a first metallic bond pad electrically coupled to the first electrical contact; and
    forming a second metallic bond pad electrically coupled to the second electrical contact, wherein the top electrode is formed from a top electrode material layer, and wherein the first and second metallic bond pads are at a metallic material layer above the top electrode material layer.

16. A method of fabricating a piezoelectric device with a piezoelectric material layer and a bottom electrode material layer, the method comprising:
    forming a top electrode on the piezoelectric material layer;
    etching the top electrode using a first oxide hard mask; and
    etching the piezoelectric material layer and the bottom electrode material layer using a second oxide hard mask different than the first oxide hard mask to produce a piezoelectric element and a bottom electrode self-aligned with the top electrode.

17. A method according to claim 16, wherein etching the piezoelectric material layer and the bottom electrode material layer using the second oxide hard mask comprises:

forming an oxide hard mask layer;
patterning the oxide hard mask layer to form a second oxide hard mask exposing portions of the piezoelectric material layer to be etched;
etching the exposed portions of the piezoelectric material layer to expose portions of the bottom electrode material layer to be etched; and
etching the exposed portions of the bottom electrode material layer.

18. A method according to claim 17, further comprising:
forming an isolation trench within the bottom electrode material layer, the isolation trench forming an electrically-isolated anchor in the bottom electrode material layer to which the top electrode is coupled.

19. A method according to claim 18, further comprising:
forming a first electrical contact to the bottom electrode material layer; and
forming a second electrical contact to the electrically-isolated anchor for making an electrical connection to the top electrode, wherein the first and second electrical contacts run underneath the bottom electrode material layer and include conductive vias to the bottom electrode material layer.

20. A method according to claim 19, further comprising:
forming a first metallic bond pad electrically coupled to the first electrical contact; and
forming a second metallic bond pad electrically coupled to the second electrical contact, wherein the top electrode is formed from a top electrode material layer, and wherein the first and second metallic bond pads are at a metallic material layer above the top electrode material layer.

* * * * *